(12) United States Patent
Hellat et al.

(10) Patent No.: US 10,546,070 B2
(45) Date of Patent: Jan. 28, 2020

(54) SIMULTANEOUS BROADBAND DAMPING AT MULTIPLE LOCATIONS IN A COMBUSTION CHAMBER

(71) Applicant: ALSTOM Technology Ltd, Baden (CH)

(72) Inventors: Jaan Hellat, Zumikon (CH); Mirko Ruben Bothien, Zürich (CH); Bruno Schuermans, La Tour de Peilz (CH); Andreas Huber, Stuttgart (DE); Nicolas Noiray, Bern (CH)

(73) Assignee: ANSALDO ENERGIA SWITZERLAND AG, Baden (CH)

( * ) Notice: Subject to any disclaimer, the term of this patent is extended or adjusted under 35 U.S.C. 154(b) by 1125 days.

(21) Appl. No.: 14/488,963

(22) Filed: Sep. 17, 2014

(65) Prior Publication Data

US 2015/0059345 A1    Mar. 5, 2015

Related U.S. Application Data

(63) Continuation of application No. PCT/EP2013/055854, filed on Mar. 20, 2013.

(30) Foreign Application Priority Data

Mar. 21, 2012 (EP) .................................. 12160558

(51) Int. Cl.
| | |
|---|---|
| *G06F 17/50* | (2006.01) |
| *F23R 3/00* | (2006.01) |
| *F23M 20/00* | (2014.01) |

(52) U.S. Cl.
CPC .......... *G06F 17/50* (2013.01); *F23M 20/005* (2015.01); *F23R 3/002* (2013.01); *F23R 2900/00013* (2013.01); *F23R 2900/00014* (2013.01)

(58) Field of Classification Search
CPC ....... F23M 20/005; G06F 17/50; F23R 3/002; F23R 2900/00013; F23R 2900/00014;
(Continued)

(56) References Cited

U.S. PATENT DOCUMENTS

| | | | |
|---|---|---|---|
| 3,483,698 A * | 12/1969 | Lewis | ....................... F02K 9/56 60/725 |
| 4,135,603 A * | 1/1979 | Dean, III | ............. G10K 11/172 181/286 |

(Continued)

FOREIGN PATENT DOCUMENTS

| | | |
|---|---|---|
| CN | 1551965 A | 12/2004 |
| CN | 101061353 A | 10/2007 |

(Continued)

OTHER PUBLICATIONS

Office Action (Text of Decision on Rejection) dated Feb. 23, 2017, by the Chinese Patent Office in corresponding Chinese Patent Application No. 201380015450.1, and an English Translation of the Office Action. (14 pages).

(Continued)

*Primary Examiner* — Jason H Duger
(74) *Attorney, Agent, or Firm* — Buchanan Ingersoll & Rooney PC

(57) ABSTRACT

The damper arrangement includes a plurality of interconnected volumes and a plurality of necks for connecting the damper to a combustion chamber at a plurality of contact points. The plurality of necks are connected to the plurality of volumes.

8 Claims, 13 Drawing Sheets

(58) Field of Classification Search
CPC . G10K 2210/3227; G10K 2210/32271; G10K 2210/32272; G10K 11/02; G10K 11/04; F01N 2490/15; F01N 2490/155; F01N 2490/16; F01N 2490/18; F01N 2490/20; F02M 35/1261; F05D 2260/96; F05D 2260/963; F01K 1/827; F02C 7/24
See application file for complete search history.

(56) References Cited

U.S. PATENT DOCUMENTS

| | | | |
|---|---|---|---|
| 5,644,918 A * | 7/1997 | Gulati | F23R 3/002 431/114 |
| 6,530,221 B1 * | 3/2003 | Sattinger | F01D 25/30 181/213 |
| 6,609,489 B1 * | 8/2003 | Slopsema | F02M 35/1261 123/184.57 |
| 7,104,065 B2 | 9/2006 | Benz et al. | |
| 7,334,408 B2 * | 2/2008 | Bethke | F23M 20/005 181/213 |
| 7,690,478 B2 * | 4/2010 | Kostun | F02M 35/1255 123/184.57 |
| 8,931,589 B2 | 1/2015 | Bothien et al. | |
| 2004/0248053 A1 | 12/2004 | Benz et al. | |
| 2005/0034918 A1 | 2/2005 | Bland et al. | |
| 2005/0199439 A1 | 9/2005 | Goenka et al. | |
| 2006/0059913 A1 | 3/2006 | Bethke et al. | |
| 2009/0277180 A1 * | 11/2009 | Lam | F23R 3/002 60/752 |
| 2011/0265484 A1 * | 11/2011 | Huber | F23R 3/002 60/755 |
| 2011/0308654 A1 | 12/2011 | Bothien et al. | |

FOREIGN PATENT DOCUMENTS

| | | |
|---|---|---|
| DE | 10 2005 062 284 A1 | 1/2008 |
| EP | 0 111 336 A2 | 6/1984 |
| EP | 1 213 539 A1 | 6/2002 |
| EP | 1213539 A1 | 6/2002 |
| EP | 1 568 869 A1 | 8/2005 |
| EP | 1 666 795 A1 | 6/2006 |
| EP | 2 385 303 A1 | 11/2011 |
| EP | 2 397 759 A1 | 12/2011 |
| EP | 2 397 760 A1 | 12/2011 |
| JP | H07139738 A | 5/1995 |
| JP | 2001141240 A | 5/2001 |
| JP | 2004183943 A | 7/2004 |
| JP | 2004183944 A | 7/2004 |
| JP | 2005527761 A | 9/2005 |
| JP | 2012002500 A | 1/2012 |

OTHER PUBLICATIONS

Office Action (Decision of Refusal) dated Apr. 3, 2017, by the Japanese Patent Office in corresponding Japanese Patent Application No. 2015-500914, and an English Translation of the Office Action. (14 pages).

* cited by examiner

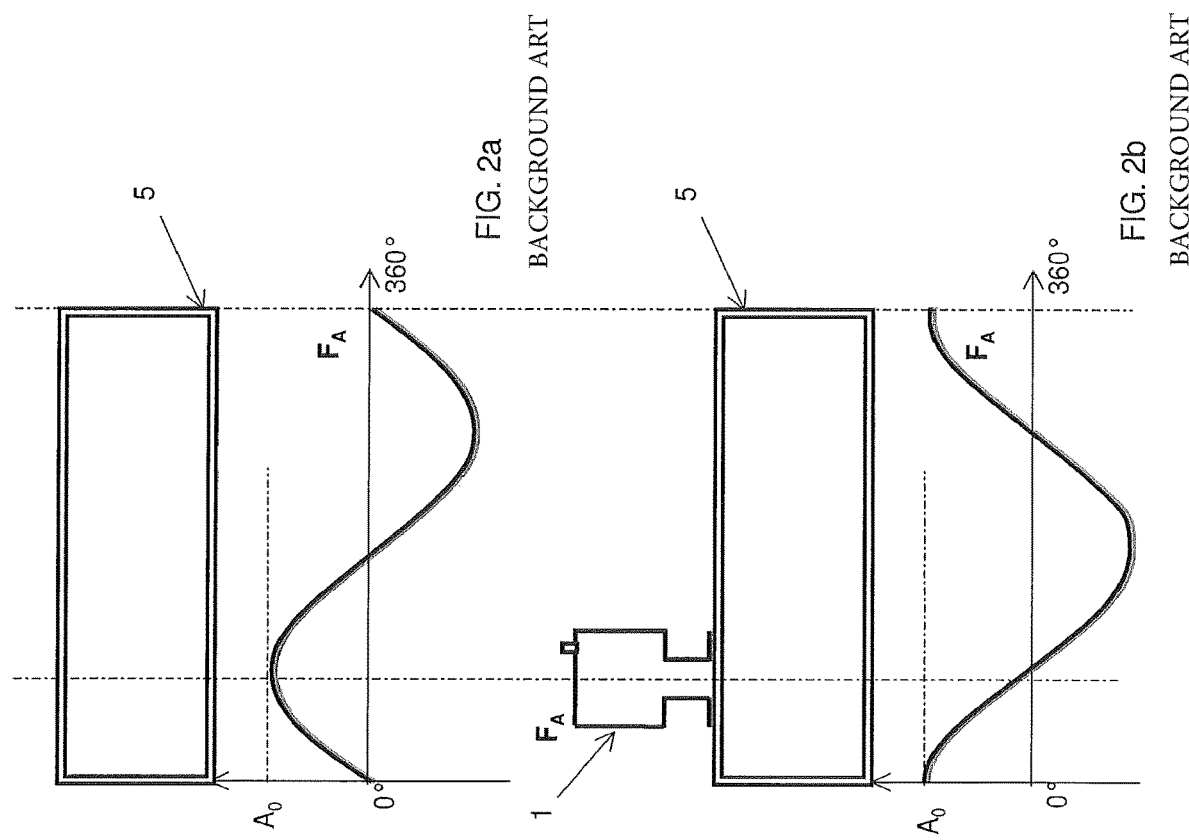

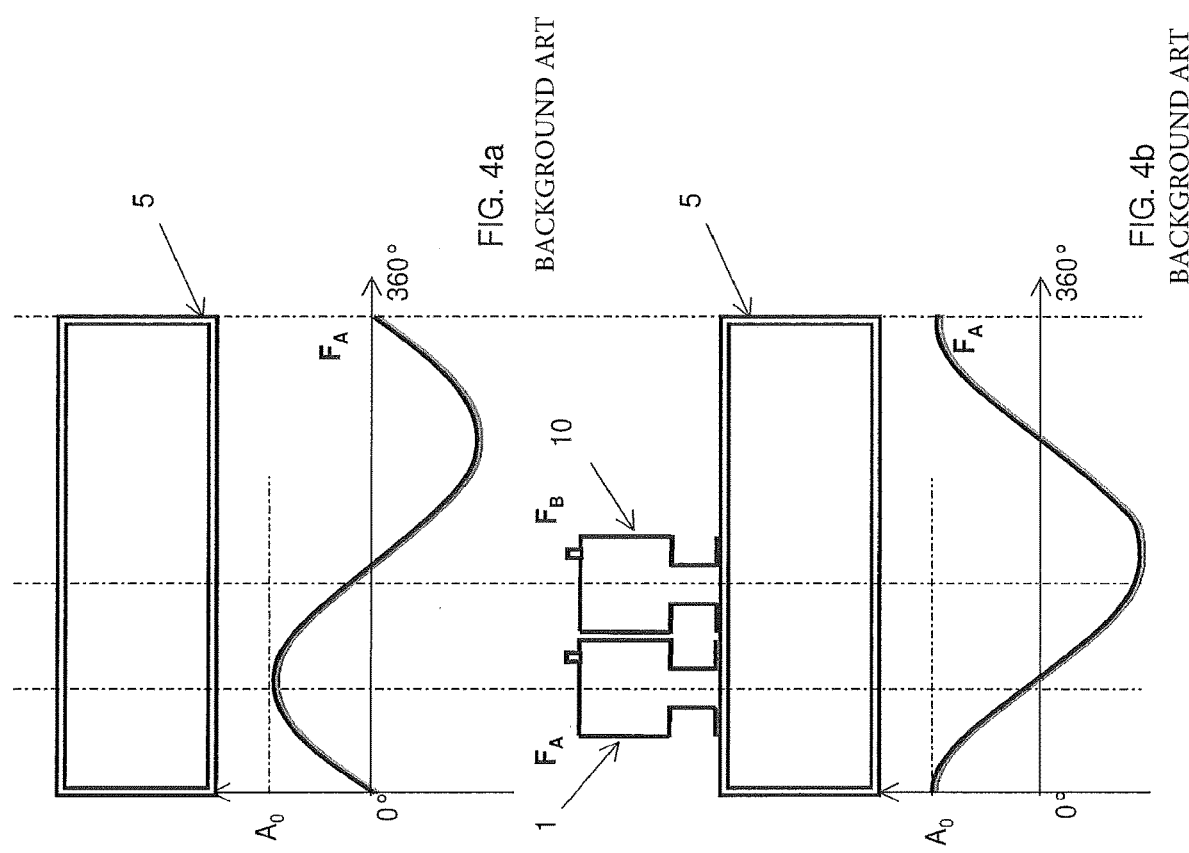

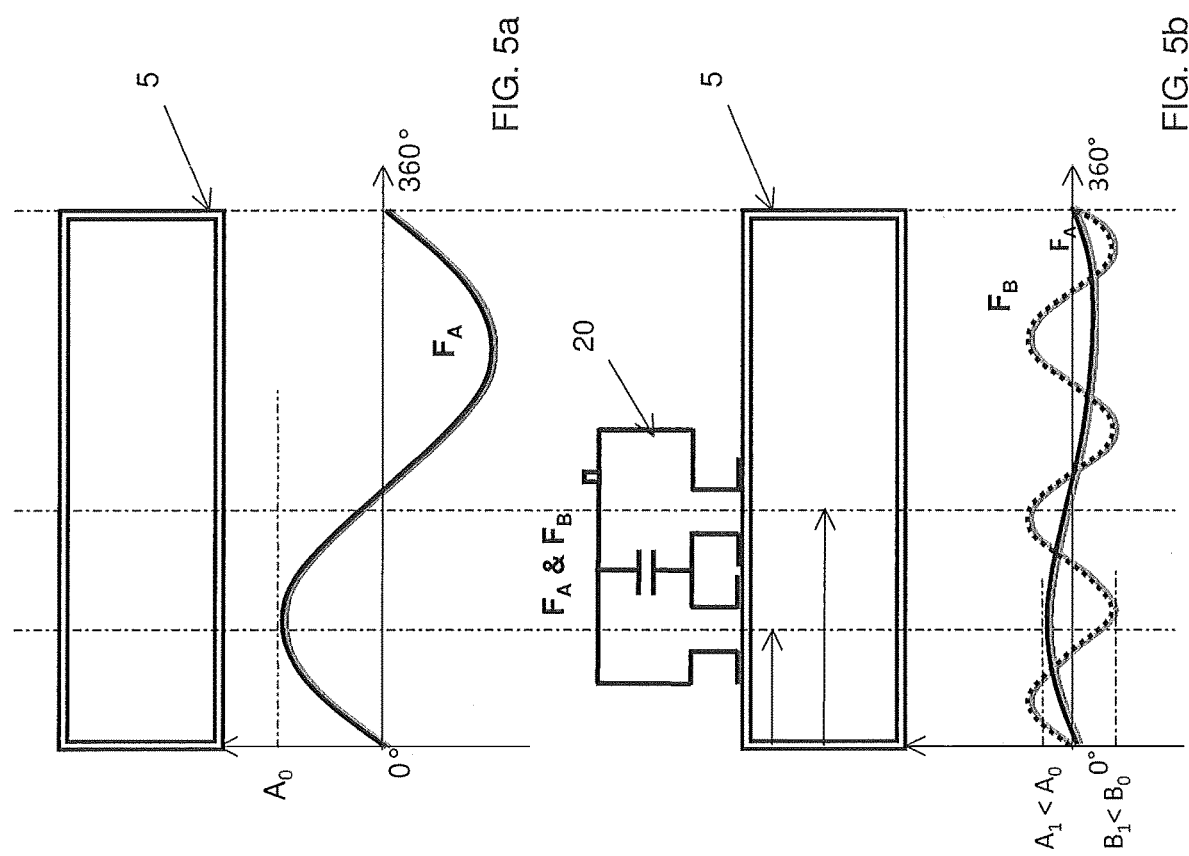

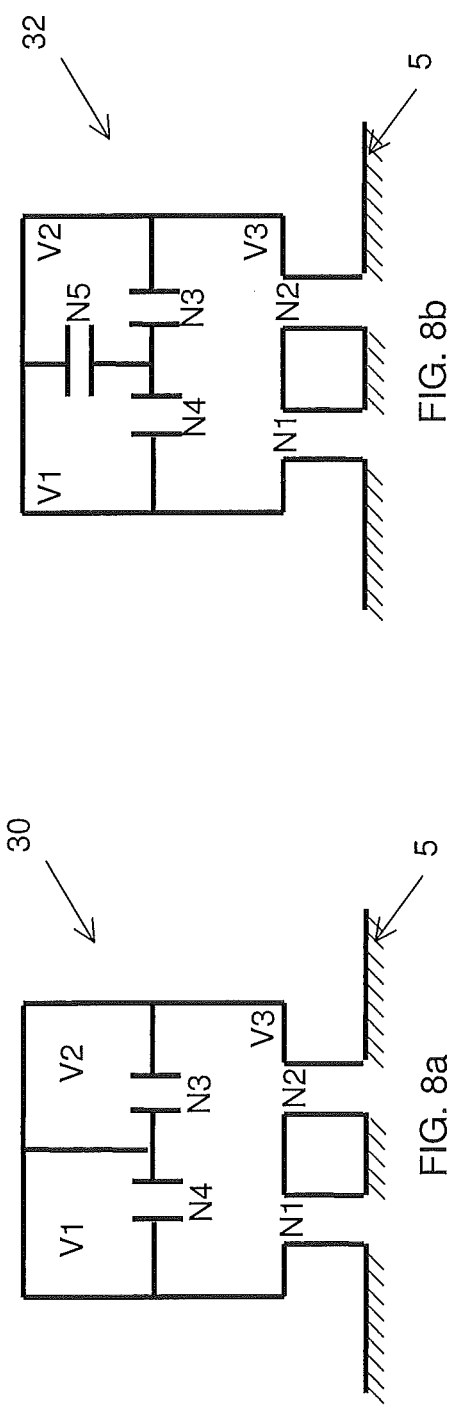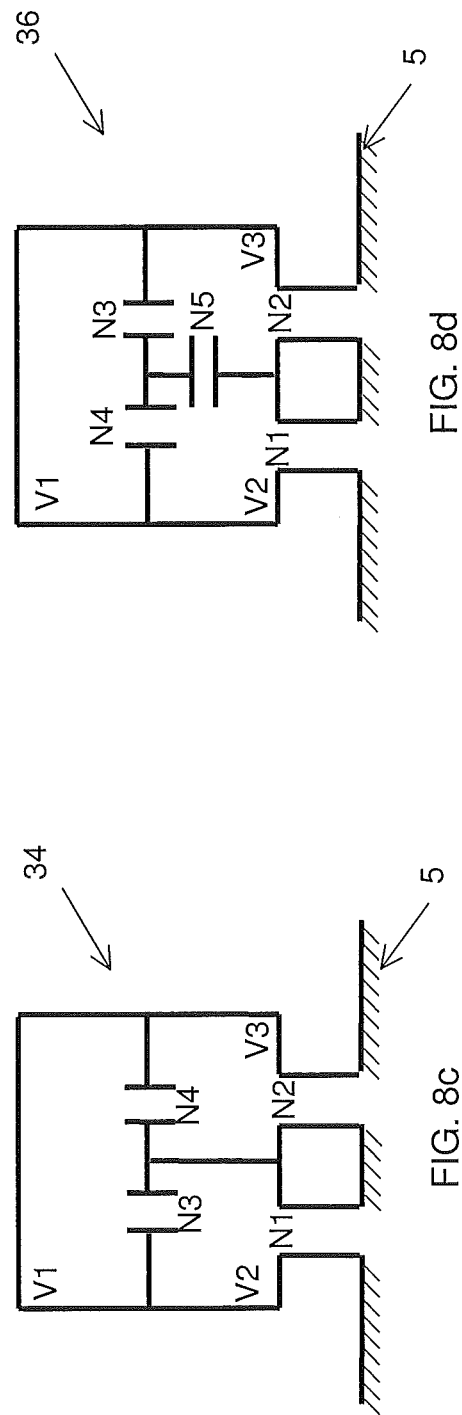

SIMULTANEOUS BROADBAND DAMPING AT MULTIPLE LOCATIONS IN A COMBUSTION CHAMBER

CROSS-REFERENCE TO RELATED APPLICATIONS

This application claims priority to PCT/EP2013/055854 filed Mar. 20, 2013, which claims priority to European application 12160558.8 filed Mar. 21, 2012, both of which are hereby incorporated in their entireties.

TECHNICAL FIELD

The present invention relates to a damper arrangement.

In particular, the damper arrangement is used to damp pressure oscillations that are generated during operation of a gas turbine provided with a lean premixed, low emission combustion system.

BACKGROUND

Gas turbines are known to comprise one or more combustion chambers, wherein a fuel is injected, mixed to an air flow and combusted, to generate high pressure flue gases that are expanded in a turbine.

During operation, pressure oscillations may be generated that could cause mechanical damages to the combustion chamber and limit the operating regime.

For this reason, usually combustion chambers are provided with damping devices, such as quarter wave tubes, Helmholtz dampers or acoustic screens, to damp these pressure oscillations.

With reference to FIG. 1, traditional Helmholtz dampers 1 include a damping volume 2 (i.e. a resonator volume) and a neck 3 (an entrance portion) that are connected to a wall 4 (shown by line pattern) of a combustion chamber 5 where the combustion occurs and pressure oscillations to be damped are generated.

The resonance frequency (i.e. the damped frequency) of the Helmholtz damper depends on the geometrical features of the damping volume 2 and entrance portion 3 (neck) and must correspond to the frequency of the pressure oscillations generated in the combustion chamber 5.

Particularly, the volume and neck geometry determine the Eigen frequency of the Helmholtz damper. The maximum damping characteristics of the Helmholtz damper is achieved at the Eigen frequency and it is typically in a very narrow frequency band.

Nevertheless, frequency of these pressure oscillations may slightly change from gas turbine to gas turbine and, in addition, also for the same gas turbine it may slightly change during gas turbine operation (for example part load, base load, transition).

Since at the low frequency range (where Helmholtz dampers are often used) the damping frequency bandwidth of the Helmholtz dampers is very narrow, such frequency shifting of the pressure oscillations generated in a combustion chamber could render a Helmholtz damper connected to it and having a prefixed design resonance frequency completely useless.

In order to address pressure oscillations having different frequencies, typically two or more Helmholtz dampers are used. For example, DE 102005062284 discloses a damper arrangement having two or also more than two Helmholtz dampers connected in series, i.e. the neck of a Helmholtz damper is connected to the volume of another Helmholtz damper. This arrangement proved to be quite efficient in damping pressure oscillation having different, far apart frequencies, such as for example 15 Hz and 90 Hz.

It is clear that in this case some of the pressure oscillations would not be damped, with a detrimental effect on the gas turbine structure and operation.

In order to damp pressure oscillations in a sufficiently large bandwidth, typically a number of Helmholtz dampers 1 are connected to the combustion chamber 5.

Nevertheless, also in this case problems may arise.

In fact, in order to efficiently damp pressure oscillations having a fixed frequency, a Helmholtz damper must be located at the position of the combustion chamber where that pressure oscillations have maximum amplitude.

It is clear that when a combustion chamber has the pressure oscillations with different frequencies having maximum amplitude at the same location or at locations close to one another, different Helmholtz dampers having different features should be installed at those locations.

Nevertheless, in combustion chamber of a gas turbine the locations where Helmholtz dampers can be connected are limited and, thus, it is usually not possible to connect different Helmholtz dampers at the same location (for example angularly shifted from one another).

Moreover, another disadvantage of this multiple Helmholtz damper arrangement is that combustion chamber's pulsations will be attenuated only by those Helmholtz dampers that have resonant frequency sufficiently close to the pulsation frequency.

This concept is explained in detail with reference to some other prior art figures. FIG. 2A shows a wave pattern corresponding to a pulsation frequency $F_A$ with amplitude A0 in combustion chamber 5. It will be apparent to a person skilled in the art that the wave pattern represented is a simplified form of a standing wave pattern shown in one timestamp having two anti-nodes, i.e., maximum amplitude points of the waveform. Now, as shown in FIG. 2B, damper 1 (which is pre-tuned to address the frequency $F_A$) is positioned at the peak of this frequency $F_A$ curve, thus it results in just damping the wave pattern at that position. In other words, damper 1 is positioned closest to one anti-node of the wave pattern of frequency $F_A$. This eventually results in shifting of mode of frequency $F_A$ (i.e., the anti-node shifts position) without actually having any affect on the amplitude A0.

With reference to FIGS. 3A and 3B, two Helmholtz dampers 1 are positioned closest to the anti-nodes of frequency $F_A$, such that it results in decrease of amplitude of frequency wave $F_A$ from A0 to A1. However, it may give rise to another mode B at a different frequency $F_B$ having amplitude B0. Hence, if one dominant mode is acted upon by using multiple dampers, another mode may become dominant and governs the dynamics of the system. Although, the amplitude of mode A is reduced but the rise of mode B increases the pulsations in combustion chamber 5. Practically, combustion systems with more than one mode are unstable.

To deal with the above-mentioned problem of two modes, two dampers tuned to two different frequencies may be used. As shown in FIGS. 4A and 4B, a second Helmholtz damper 10 tuned to frequency $F_B$ is used. However, in this case, the first mode A is again not completely damped but gets shifted as was explained in FIG. 2B. Moreover, the second mode B may not also get completely damped by damper 10, as it may not have an anti-node at the location where damper 10 is connected to combustion chamber 5. Thus, even by using two dampers tuned to two different frequencies $F_A$ and $F_B$ it does not ensure that both frequencies will be damped at the locations where both dampers contact the combustion chamber.

Hence, all above-mentioned solutions suffer from the issue of not being able to address all relevant frequencies to provide a broadband damping. Moreover, these solutions do not allow fine tuning of the resonance frequency to follow shifting of the frequency pressure oscillations in the combustion chamber.

SUMMARY

The technical aim of the present invention therefore includes providing a damper arrangement addressing the aforementioned problems of the known art. Within the scope of this technical aim, an aspect of the invention is to provide a damper arrangement and a method for designing same that permit damping of pressure oscillations in a large damping bandwidth, in particular when compared to the bandwidth of traditional damp arrangements made of Helmholtz dampers.

A further aspect of the invention is to provide a damper arrangement that is able to cope with the frequency shifting of the pressure oscillations with no or limited need of fine tuning.

Another aspect of the invention is to provide a damper arrangement that is able to simultaneously damp multiple pulsation frequencies in broadband range by being connected to a combustion chamber at more than one location.

Another aspect of the invention is to provide a damper arrangement that is very simple, in particular when compared to the traditional damper arrangements described above.

Yet another aspect of the invention is to provide a damper arrangement that comprises a plurality of interconnected volumes and a plurality of necks for connecting the damper arrangement to a combustion chamber at a plurality of contact points. The plurality of necks are connected to the plurality of volumes.

In another aspect of the invention, the plurality of contact points correspond to one or more pulsation frequencies.

In yet another aspect of the invention, the combination of plurality of volumes and necks are tuned to damp one or more pulsation frequencies.

The technical aim, together with these and further aspects, are attained according to the invention by providing a damper arrangement and a method for designing same in accordance with the accompanying claims.

BRIEF DESCRIPTION OF THE DRAWINGS

Further characteristics and advantages of the invention will be more apparent from the description of a preferred but non-exclusive embodiment of the damper arrangement illustrated by way of non-limiting example in the accompanying drawings, in which:

FIGS. 2A and 2B show different arrangements of Helmholtz dampers according to the prior art;

FIGS. 4A and 4B show different arrangements of Helmholtz dampers according to the prior art;

FIGS. 5A and 5B show an arrangement of the Helmholtz dampers in accordance with an embodiment of the invention;

FIGS. 8A through 8D show different arrangements of Helmholtz dampers in accordance with different embodiments of the invention;

DETAILED DESCRIPTION

Figure 1:
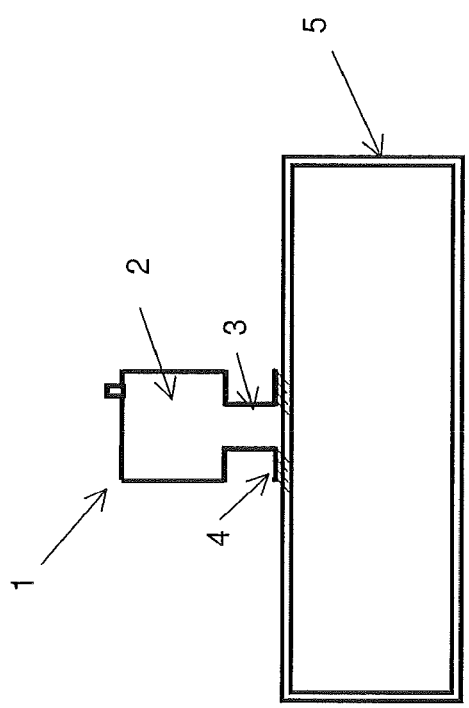
FIG. 1 is a schematic view of a traditional Helmholtz damper according to the prior art.
Figure 3A:
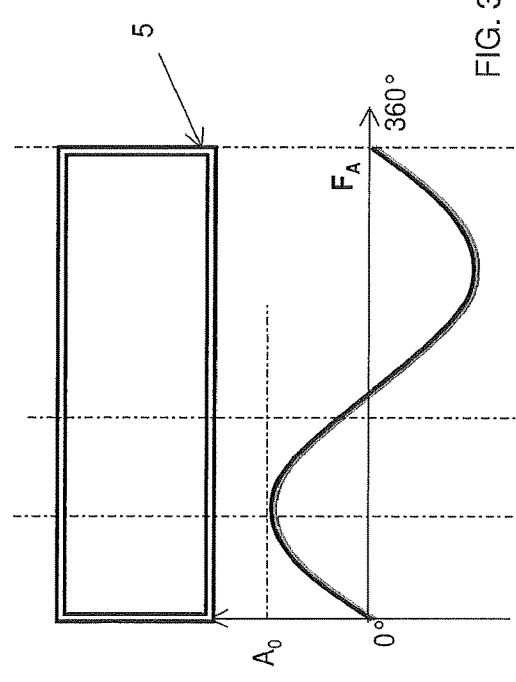
FIGS. 3A and 3B show different arrangements of Helmholtz dampers according to the prior art.
Figure 3B:
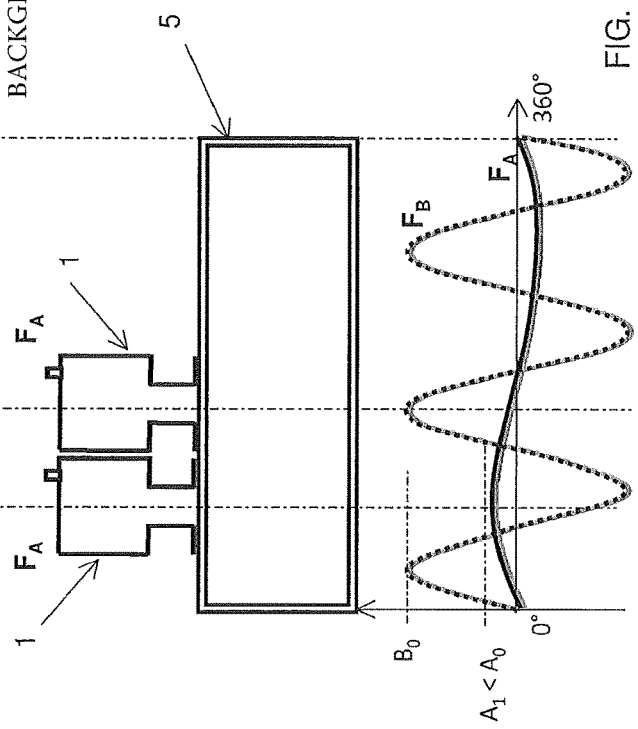

Preferred embodiments of the present disclosure are now described with reference to the drawings, wherein like reference numerals are used to refer to like elements throughout. In the following description, for purposes of explanation, numerous specific details are set forth in order to provide a thorough understanding of the disclosure. It may be evident, however, that the disclosure may be practiced without these specific details.

With reference to FIGS. 5A and 5B, in order to deal with the problem of handling modes of two frequencies occurring simultaneously at two different locations with a single damper, a damper 20 is positioned at combustion chamber 5. Combustion chamber 5 in exemplary embodiment is the combustion chamber of a gas turbine. In this exemplary embodiment, damper 20 comprises two necks and two volumes that are coupled in parallel. The distance between the two necks is represented by the distance between two arrows (as shown within combustion chamber 5), and it defines the two contact points where damper 20 touches combustion chamber 5. However, it will be apparent to a person skilled in the art that this design is only exemplary and the damper may be arranged in various other neck and volume combinations. In contrast to the two damper (damper 1 and 10) embodiment shown in FIGS. 4A and 4B, a single damper 20 (as shown in FIG. 5B) is tuned to two dominant frequencies $F_A$ and $F_B$. Both modes of $F_A$ and $F_B$ are damped and the amplitude of both wave patterns reduces from A0 to A1 and B0 to B1. In other words, damper 20 is able to simultaneously damp the anti-nodes of both frequencies $F_A$ and $F_B$, occurring at both contact points. In practical implementation, first the position of the anti-nodes of both $F_A$ and $F_B$ are estimated, and then accordingly the contact points of damper 20 (i.e., the distance between the two necks) are selected. The location of the contact points is preferably kept closest to the estimated anti-nodes position of $F_A$ and $F_B$. Hence, a single damper 20 is able to deal with one or more dominant frequency present in combustion chamber 5. It will be apparent to a person skilled in the art that the design of damper 20 could be easily extended to an arbitrary number of connections to combustion chamber 5, depending on the number of dominant frequencies that need to be damped. In accordance with another embodiment of the invention, damper 20 may be used to damp only one dominant frequency that has maxima are two locations in combustion chamber 5. Moreover, the contact points at which damper 20 may touch combustion chamber 5 may be distributed in all three dimensions. It is only for the sake of simplified explanation that all embodiments have been shown in two dimensions; however, this does not limit the scope of this invention.

Figure 6:
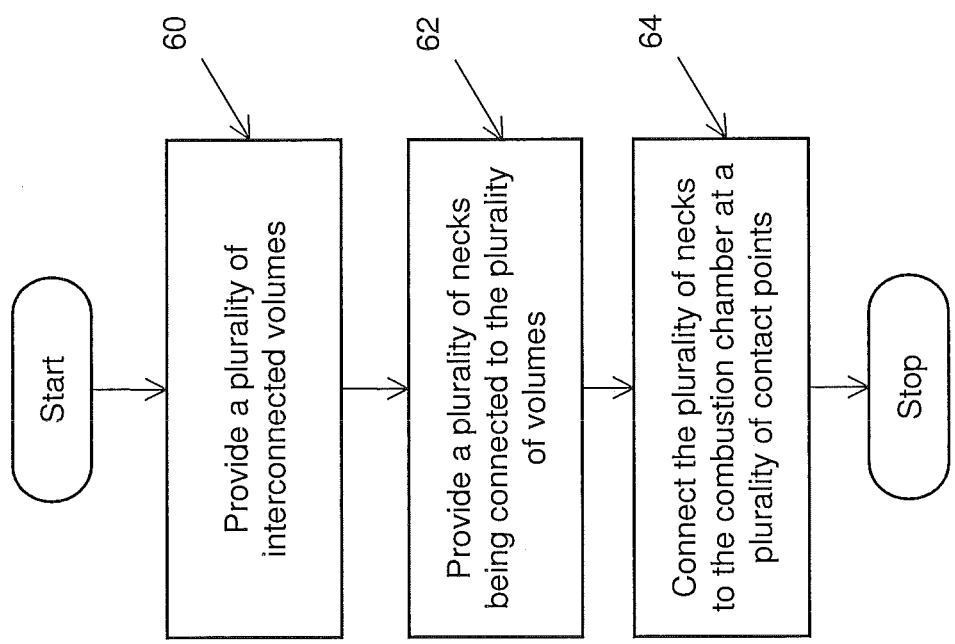
FIG. 6 is a flowchart of a method of designing a Helmholtz damper arrangement for a combustion chamber in accordance with an embodiment of the invention.

In accordance with an embodiment of the invention, FIG. 6 describes a flowchart of a method of designing Helmholtz damper 20 for combustion chamber 5. Prior to designing damper 20, an expected acoustic wave pattern occurring (due to pulsation frequencies $F_A$ and $F_B$) in combustion chamber 5 is analyzed and corresponding locations of the anti-nodes of both frequencies is estimated based on certain standard mathematical calculations. Based on these estimated locations, the contact points where damper 20 touches combustion chamber 5 are selected by defining the distance between the two necks of damper 20. The overall design of damper 20 is done according to the following steps of flowchart in FIG. 6.

At first step 60, a plurality of volumes are interconnected. The volumes may be interconnected in either series or parallel. Thereafter, at second step 62, a plurality of necks are provided that are connected to the plurality of interconnected volumes. At final step 64, the plurality of necks are connected to combustion chamber 5 at a plurality of contact points. The location of these contact points is already estimated based on the above-mentioned analysis. Similar to the interconnected volumes, the necks may also be arranged in series or parallel with respect to each other and the volumes. In accordance with various forthcoming embodiments of the invention, various possibilities of arranging such interconnections between volumes and necks are explained.

Figure 7A:
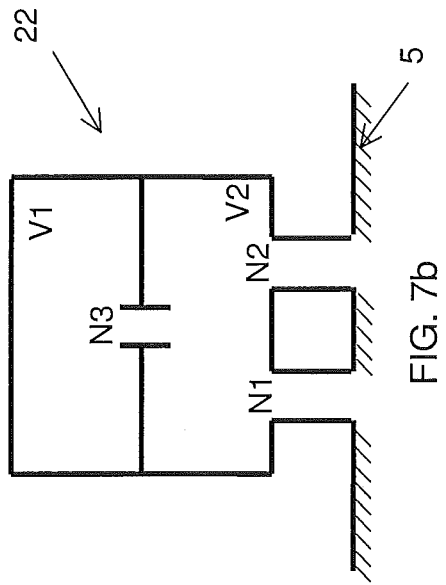
FIGS. 7A through 7D show different arrangements of Helmholtz dampers in accordance with different embodiments of the invention.

FIGS. 7A through 7D show exemplary arrangement of a Helmholtz damper in accordance with an embodiment of the invention. In accordance with one embodiment, as shown in FIG. 7A, damper 20 consists of two volumes, volume V1 and volume V2 that are interconnected to each other in parallel. The two volumes, V1 and V2, are connected to combustion chamber 5 (represented by line pattern) via two necks, neck N1 and neck N2. Moreover, the two volumes V1 and V2 are interconnected in parallel via a third neck N3. The two volumes V1 and V2 are defined such that the damper 20 arrangement is able to damp two frequencies, $F_A$ and $F_B$. Also the location of two necks, N1 and N2, can be selected so as to adapt the overall damper 20 to the local standing wave pattern (of $F_A$ and $F_B$) in combustion chamber 5. In various embodiments of the invention, the two necks, N1 and N2, are preferably coaxial to each other. It will be apparent to a person skilled in the art that the Helmholtz damper will have best damping effect when it is close to the pulsation maximum of the standing wave pattern. As damper 20 has two necks interfacing with combustion chamber 5, there is a better provision to adjust the location of two necks, N1 and N2, closer to the pulsation maxima for different pulsation (dominant) frequencies.

Figure 7B:
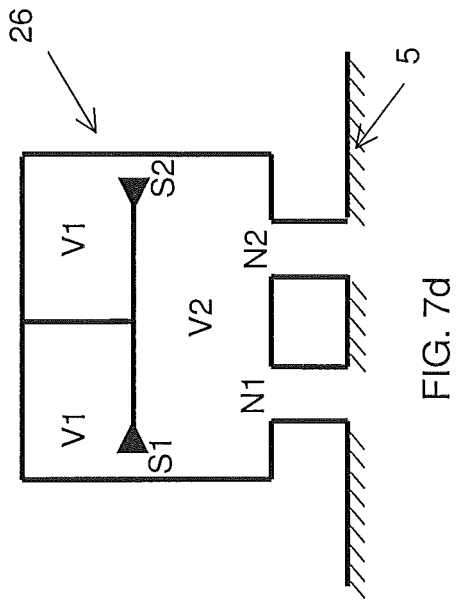

In accordance with another embodiment, as shown in FIG. 7B, a damper 22 consists of two necks, neck N1 and neck N2, being connected to two volumes, V1 and V2, that are interconnected to each other in series via a third neck N3. Again, volumes V1 and V2 may be selected depending on the dominant frequencies that need to be damped by Helmholtz damper 22.

Figure 7C:
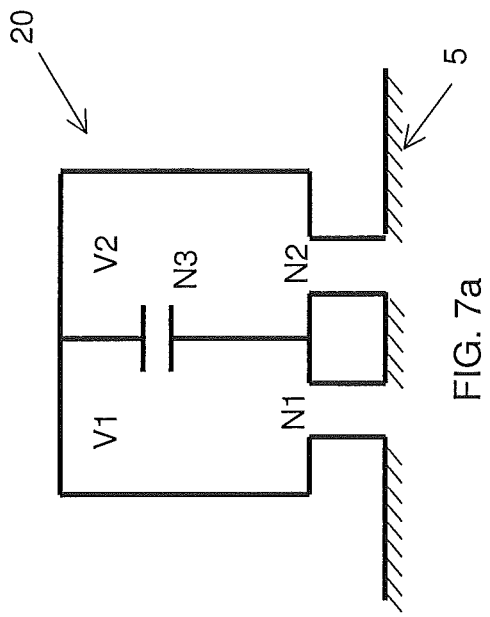

Similar to damper 22, in accordance with yet another embodiment of the invention, in FIG. 7C a damper 24 consists of two volumes, V1 and V2, being connected in series via two necks, N3 and N4, (instead of one neck N3 as in FIG. 7B). This arrangement of two necks, N3 and N4, in damper 24 provides more flexibility to fine tune damper 24 to adjust to the two pulsation frequencies.

Figure 7D:
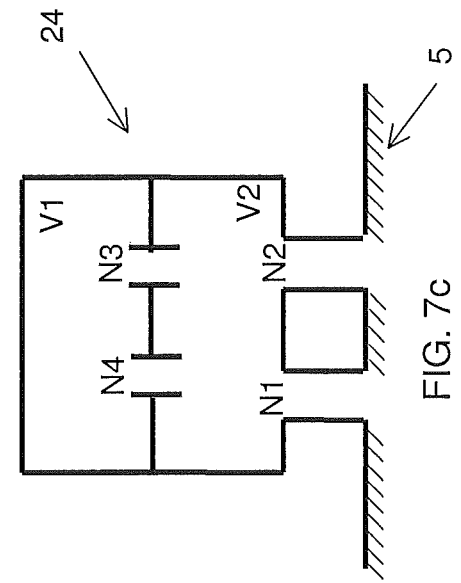

In another embodiment of the invention, as shown in FIG. 7D, a damper 26 has two volumes, V1 and V2, interconnected in series via annular slots, S1 and S2, instead of tubular necks (as explained in previous FIGS. 7A, 7B and 7C). It will be appreciated by a skilled person that this is only a design variation with respect to other figures (FIGS. 5A, 5B, 7A, 7B and 7C) explained above. Further, the design of slots S1 and S2 can be varied to fine tune damper 26 to adjust to the two pulsation frequencies.

So far, in accordance with various embodiments of the invention, two Helmholtz dampers have been used to create the damper arrangement that connects to the combustion chamber at two points (through its two necks). However, it will be apparent to a person skilled in the art that more than two Helmholtz dampers can also be used to define a new damper arrangement that is able to damp two pulsation frequencies at two locations (through its two necks).

As shown in FIG. 8A, a damper 30 has three volumes where volumes V1 and V2 are interconnected in parallel and this combination is further interconnected to a third volume V3 in series via necks N3 and N4. The overall arrangement of damper 30 is connected to combustion chamber 5 via necks N1 and N2 at two points.

Similar to damper 30, another damper 32, as shown in FIG. 8B, also has three volumes, V1 and V2 being in parallel to each other, and, together in series with volume V3 via neck N3 and N4. However, in this embodiment, volume V1 and V2 are interconnected in parallel via a neck N5. This arrangement of damper 32 provides more flexibility in fine tuning to the pulsation frequencies.

In yet another embodiment of the invention, as shown in FIG. 8C, damper 34 consists of volume V1 being connected in series to volumes V2 and V3 that are in turn connected to each other in parallel, via necks N3 and N4 respectively.

In another embodiment of the invention, similar to damper 32, in FIG. 36, volume V1 is connected in series to volumes V2 and V3, via necks N4 and N3 respectively. However, volume V2 and V3 are interconnected in parallel via neck N5.

In all above-explained damper arrangements in FIGS. 8A through 8D, three dampers are interconnected to fine tune the overall damper to adapt itself to two pulsation frequencies that are damped at locations where two necks, N1 and N2, connect to combustion chamber 5.

Figure 9A:
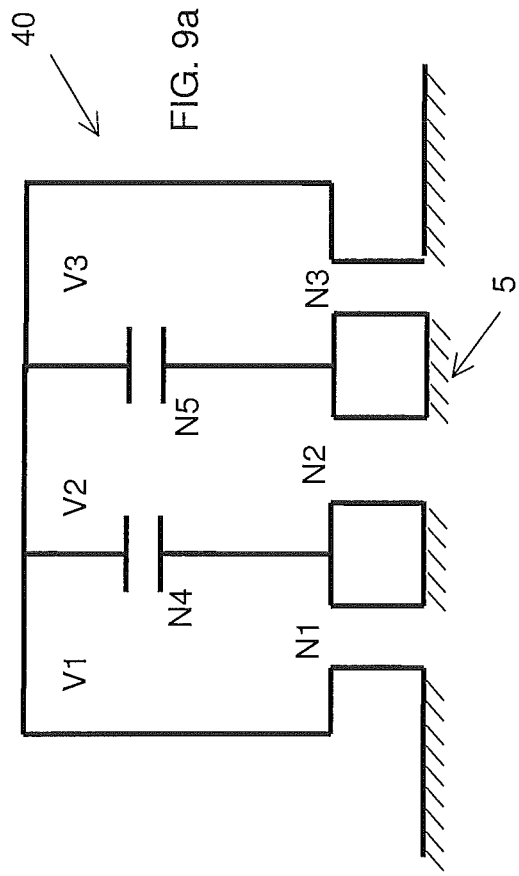
FIGS. 9A and 9B show different arrangements of Helmholtz dampers in accordance with different embodiments of the invention.
Figure 9B:
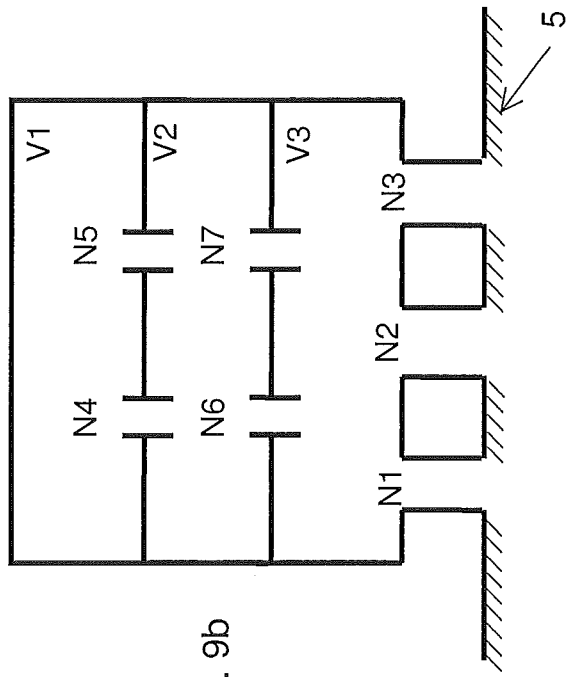

In accordance with yet another embodiment of the invention, three dampers are interconnected to damp three pulsation frequencies in the combustion chamber. As shown in FIGS. 9A and 9B, three dampers are interconnected in a series and parallel combination to damp three pulsation frequencies. In FIG. 9A, a damper 40 has three volumes, V1, V2 and V3, interconnected in parallel. Damper 40 connects to combustion chamber 5 via three necks, N1, N2 and N3. The three volumes are interconnected via necks N4 and N5. All these necks are tubular design and are preferably coaxial to each other.

Similarly, in FIG. 9B, three volumes, V1, V2 and V3, are interconnected in parallel to form a damper 42. Damper 42 connects to combustion chamber 5 via three necks, N1, N2 and N3. Volume V1 is connected to volume V2 in parallel via two necks, N4 and N5. Likewise, volume V2 is connected to volume V3 in parallel via two necks, N6 and N7. This two neck arrangement of connecting two volumes in parallel provides more flexibility in fine tuning the overall damper 42 for damping three pulsation frequencies. It will also be apparent to a person skilled in the art that these three dampers arrangement may be used to damp only one pulsation frequency that has maxima at three different locations in combustion chamber 5, which correspond to the location of necks N1, N2 and N3.

In accordance with various embodiments of the invention, this concept of interconnected neck and volume design arrangement can be extended to any number of volumes and necks depending on the damping requirements in the combustion. For instance, a four neck design may be created using an interconnection of four volumes to damp two pulsation frequencies each having two maxima.

It will be appreciated by a person skilled in the art that the invention through its various embodiments only provides some exemplary design to illustrate the concept of interconnected volumes and necks. These embodiments do not in any sense intend to limit the scope of the invention to just these arrangements.

Figure 10A:
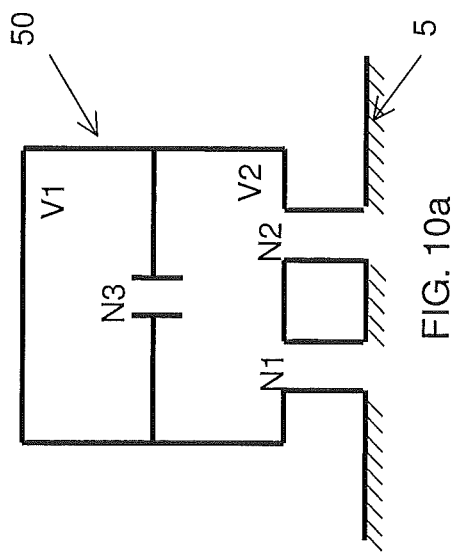
FIGS. 10A through 10D show different arrangements of Helmholtz dampers using absorption materials to adjust acoustic coupling between the volumes, in accordance with various embodiments of the invention.

So far in the embodiment described above, we have described design arrangements where typical tubular necks have been used to interconnect the volumes and the overall damper to the combustion chamber. FIGS. 10A through 10D shows different arrangements of Helmholtz dampers using absorption materials (as necks) to adjust acoustic coupling between the volumes, in accordance with various embodiments of the invention. Various absorption materials such as perforated screens, porous ceramics or metal foams are used for coupling two Helmholtz dampers. In FIG. 10A shows a damper 50 having two volumes V1 and V2 connected in series via neck N3. In this design the neck N3 is a regular tubular shape or pipe share opening between two volumes V1 and V2. This design arrangement is similar to damper 22 in FIG. 7B.

Figure 10B:
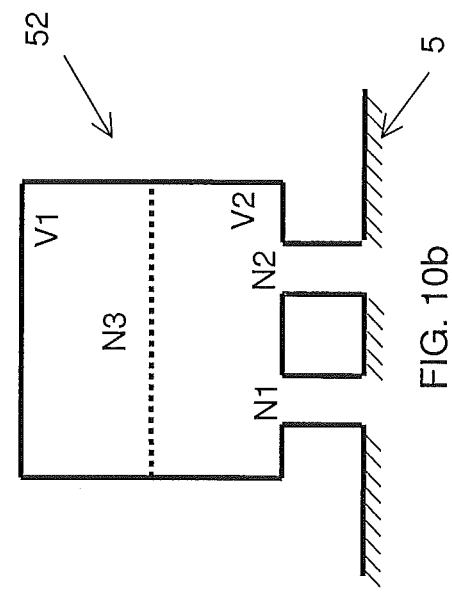

In accordance with an embodiment of the invention, FIG. 10B shows a damper 52 that has two volumes, V1 and V2, interconnected in series via neck N3. Damper 52 connects to combustion chamber 5 via necks N1 and N2. In this case neck N1 and N2 are standard tubular shape open necks, however, neck N3 is a perforated screen. This neck N3 may have absorption properties so that allows adjusting the two volumes acoustically.

Figure 10C:
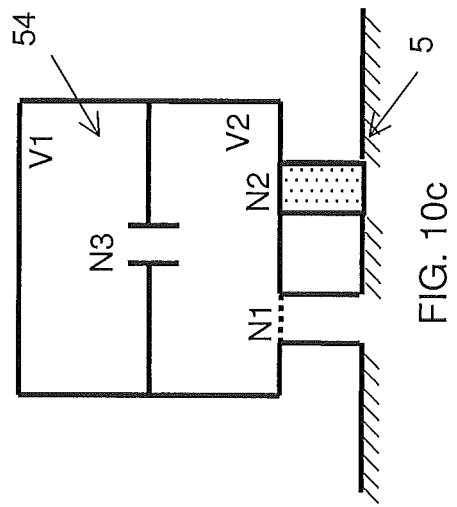

In accordance with another embodiment of the invention, FIG. 10C shows a damper 54 that has two volumes V1 and V2 connected in series via neck N3. Damper 54 further connects to combustion chamber 5 via necks N1 and N2. In this case, the neck N3 is standard open neck design. However, neck N1 has a perforated screen on the inner side of the volume V2 and neck N2 has absorption material, such as metal foam inserted along the entire length of neck N2. In another embodiment of the invention, neck N2 has absorption material to enhance viscous dissipation in order to increase damping efficiency of damper 54. In yet another embodiment of the invention, the absorption material is a perforated plate or a vortex generator.

Figure 10D:
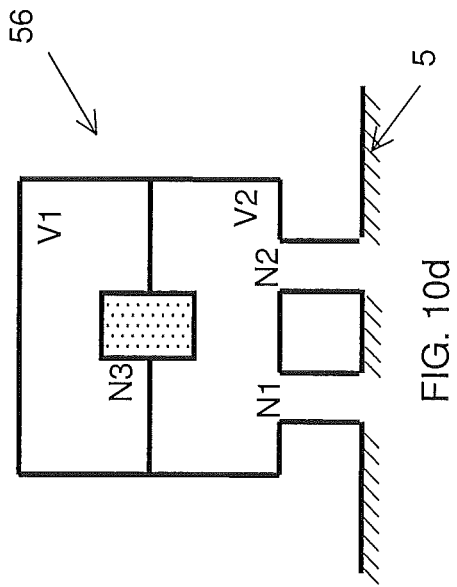

In yet another embodiment of the invention, FIG. 10D shows a damper 56 that has two volumes V1 and V2, connected in series via neck N3. Damper 56 further connects to combustion chamber 5 via necks N1 and N2. In this case, the neck N3 has a tubular shape design, which is filled with absorptive material such porous ceramic or metal foam.

It will be apparent to a person skilled in the art that all these variations in use of such absorptive material in either of these necks is purely exemplary. Any of these necks may use such material to change the acoustic properties of the two volumes and thus adjust the damping characteristics of the overall damper arrangement.

Even though these damper designs operate in broadband range, they still require fine tuning of their Eigen frequencies. In accordance with various embodiments of the invention, in one approach, the interconnected volumes are varied by insertion of movable bodies like pistons. The advantage of this approach is that each volume can be varied independently providing more flexible fine tuning. FIG. 11A through 11D show different arrangements of Helmholtz dampers using the piston to adjust acoustic coupling between the volumes.

Figures 11A, 11B, 11C, 11D:
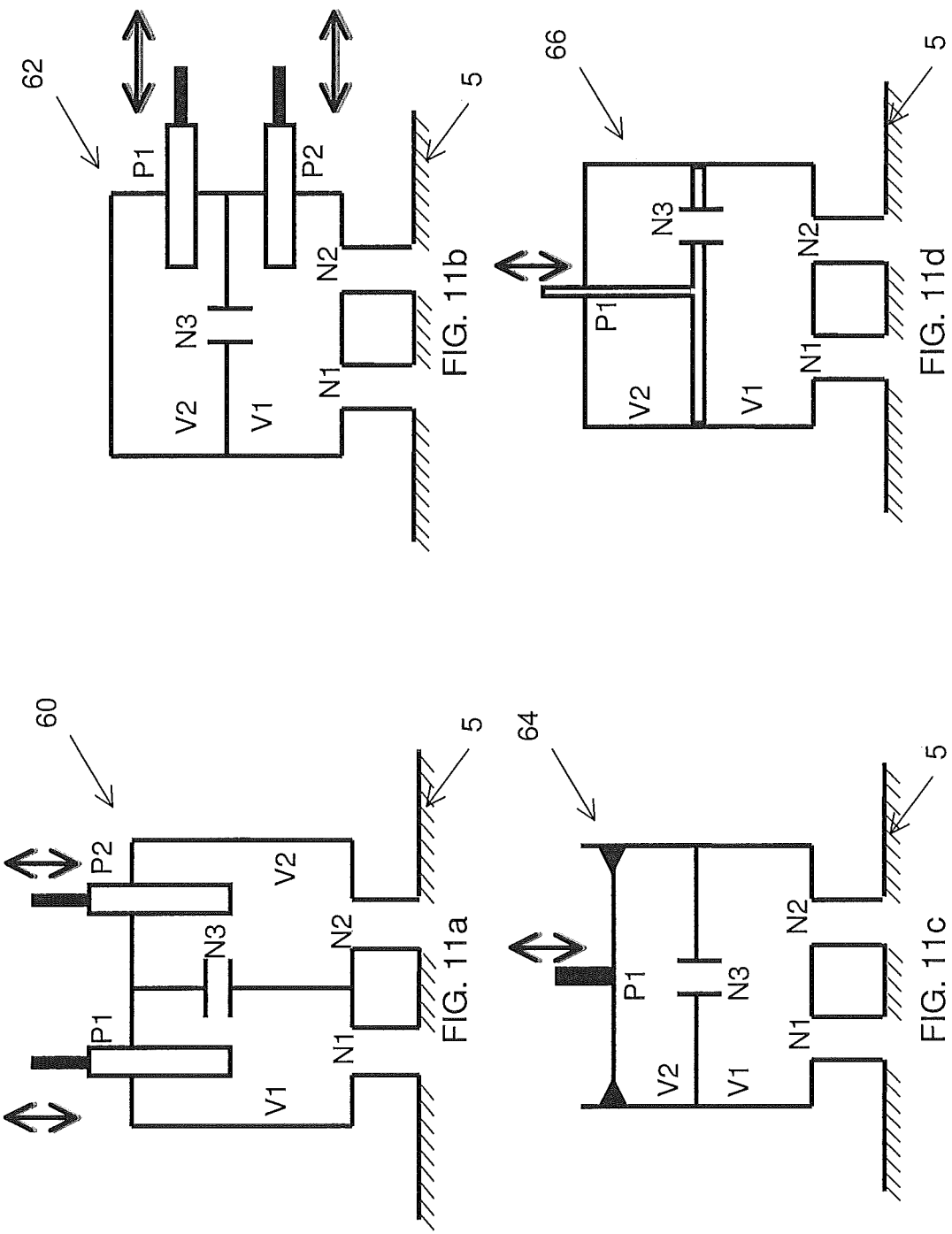
FIGS. 11A through 11D show different arrangements of Helmholtz dampers using piston to adjust acoustic coupling between the volumes, in accordance with various embodiments of the invention.

In accordance with a first embodiment of the invention, in FIG. 11A a damper 60 has two volumes, V1 and V2, connected in parallel via neck N3 and the damper 60 connects to combustion chamber 5 via neck N1 and N2. Now the volumes V1 and V2 are varied by using pistons P1 and P2, respectively. In accordance with various embodiments of the invention, pistons P1 and P2 are slidable pistons, i.e., they can move in to and fro direction either vertically or horizontally with respect to the axis of damper, depending on their orientation. Piston P1 defines the volume V1 and likewise piston P2 defines the volume V2. The pistons P1 and P2 are moved vertically up and down (as shown by arrows), i.e., along the axis of the necks N1 and N2, to vary the volumes V1 and V2.

In another arrangement, in FIG. 11B, a damper 62 has two volumes, V1 and V2, connected in series via neck N3 and further damper 62 connects to combustion chamber 5 via necks N1 and N2. In this case, volumes V1 and V2 have two pistons, P1 and P2, inserted horizontally (as shown by arrows), i.e., perpendicular to the axis of the necks N1 and N2. Both dampers 60 and 62 allow for change in volumes V1 and V2 through the pistons P1 and P2, respectively.

In some case, it may also be required to vary only one of the volumes independent of the other volume. In accordance with one embodiment of the invention, FIG. 11C shows a damper 64 that has two volumes, V1 and V2, connected in series via neck N3. Damper 64 connects to combustion chamber 5 via necks N1 and N2. However, in this damper, only neck V2 can be varied using a slideable wall that is driven by piston P1. The direction of movement of piston P1 is vertical, up and down, as shown by the arrow. This slideable wall is the wall that is opposite to the internal wall of volume V2 that is common to volume V1. It will be apparent to a person skilled in the art that this one volume movable arrangement is also applicable where two volumes are connected in parallel (as shown in FIG. 11A for damper 60). In such a case one of the external vertical walls would be a movable slideable wall.

Another method of tuning these Helmholtz dampers is to vary both the volumes V1 and V2 simultaneously by using a movable splitter plate between the two volumes. In accordance with one embodiment of the invention, FIG. 11D shows a damper 66 that has two volumes, V1 and V2, interconnected in series via a movable splitter plate that has a neck N3. This movable splitter plate is driven by a piston P1 in vertical direction (as shown by the arrow). The piston P1 defines two volumes, a first volume V1 on one side of the piston P1 and a second volume V2 on the other side of the piston P1. In accordance with an embodiment of the invention, the piston P1 may be controlled by a control unit that has an actuator rod (not shown in FIG. 11D) that drives the piston P1. The control unit may contain multiple pulsation frequency sensors attached to the combustion chamber 5 that provide information about the maxima of the pulsation frequencies originating in combustion chamber 5. Based on the inputs from the control unit, the actuator rod drives the piston P1 in either direction (up or down) to adjust the volumes V1 and V2 and thus fine tune Helmholtz damper 66 for one or more pulsation frequencies in combustion chamber 5.

In all the embodiments described so far, various arrangements have been shown where volumes have been varied to fine tune the damping frequency of the Helmholtz damper. However, it is also possible, in accordance with various embodiments of the invention, that this fine tuning of dampers is done by varying the neck geometry with bluff bodies. This effectively varies the oscillating mass of the Helmholtz damper.

Figure 12B:
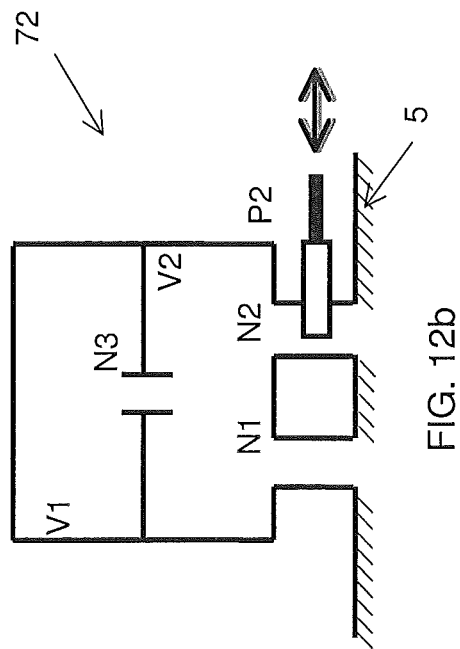
FIGS. 12A through 12C show different arrangements of Helmholtz dampers using piston in the neck of the damper to tune the size of neck connecting the dampers, in accordance with various embodiments of the invention.
Figure 12A:
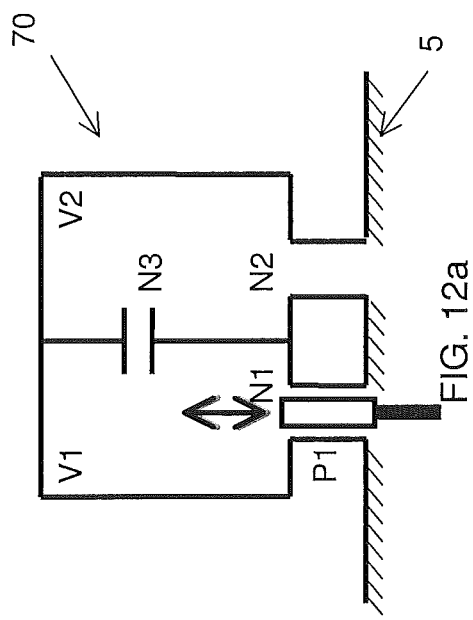
Figure 12C:
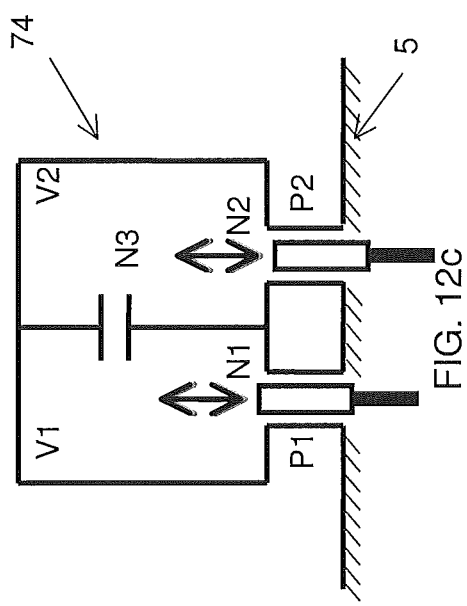

FIGS. 12A through 12C show different arrangements of Helmholtz dampers using pistons in the neck of the damper to tune the size of neck connecting the dampers, in accordance with various embodiments of the invention. In FIG. 12A a damper 70 that has two volumes, V1 and V2, interconnected in parallel via neck N3. Damper 70 further connects to combustion chamber 5 via necks N1 and N2. The geometry of neck N1 is varied by inserting a piston P1 that moves in vertical direction (as shown by the arrow). This variation in the neck allows to fine tune the damping frequency of damper 70.

In another embodiment of the invention, in FIG. 12B, a damper 72 has two volumes, V1 and V2, interconnected in series, via a neck N3. Damper 72 further connects to combustion chamber 5 via necks N1 and N2. In this case the geometry of neck N2 is varied by inserting a piston P2 that moves horizontally across the neck (i.e., perpendicular to the axis of the neck, as shown by the arrow).

In yet another embodiment of the invention, in FIG. 12C, a damper 74 with two volumes, V1 and V2, are interconnected in parallel via neck N3. Damper 74 further connects to combustion chamber 5 via necks N1 and N2. In this case, both these connecting necks N1 and N2 have variable geometry using pistons P1 and P2, respectively.

Figure 13B:
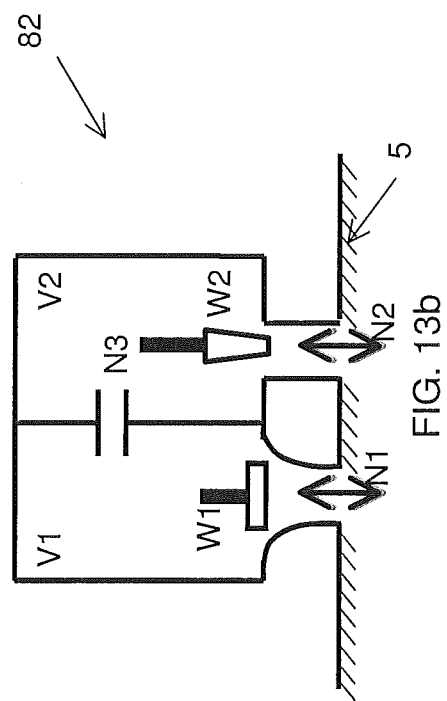
FIGS. 13A and 13B show different arrangements of Helmholtz dampers having different cross-sections of the necks with use of pistons to tune the size of neck and adjust acoustic coupling between the volumes, in accordance with various embodiments of the invention.
Figure 13A:
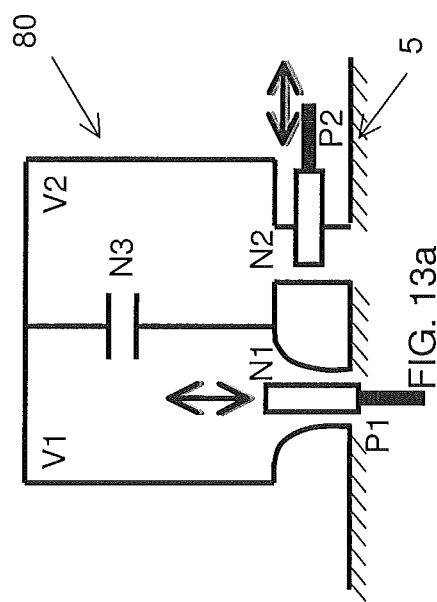

It will be apparent to a person skilled in the art that this variation in the geometry of the necks can also be achieved by changing the structure/cross-section of the neck itself. FIGS. 13A and 13B show different arrangements of Helmholtz dampers having different cross-sections of the necks with use of pistons to tune the size of neck and adjust acoustic coupling between the volumes, in accordance with various embodiments of the invention.

FIG. 13A shows a damper 80 that has two volumes, V1 and V2, interconnected in parallel via a neck N3. Damper 80 connects to combustion chamber 5 via neck N1 and N2. Neck N1 has a curved cross section instead of a tubular/cylindrical cross-section. The neck N2 has standard tubular cross-section. Both these necks N1 and N2 have pistons P1 and P2 that further allow variation in geometry of these necks.

In accordance with another embodiment of the invention, FIG. 13B shows a damper 82 with two volumes, V1 and V2, interconnected in parallel via neck N3. Damper 82 further connects with combustion chamber via necks N1 and N2. In this case, the neck N1 has a curved cross-section, while the neck N2 has standard cylindrical cross-section. Instead of a regular piston (as shown in above embodiments), the neck N1 has a slideable wedge W1, and neck N2 has a slidable wedge W2 that allows for variation in the geometry of these necks to fine tune the damping frequencies of the Helmholtz damper.

It will be apparent to a person skilled in the art that even though in all above-mentioned embodiments, cross-sectional shape of volumes and neck are shown as rectangular, the volumes and necks are not limited to just this shape. In accordance with various embodiments of the invention, volumes and necks may have a polygonal, cubical, cuboidal, spherical or any non-regular shape. Any of these shapes (now shown) could be used to define the damper arrangement depending on the damping requirements of the combustion chamber.

In order to cool the components of all damper arrangements, as described in above-mentioned embodiments, cooling holes may be provided in either of the volumes (V1 or V2 or V3) to allow cooling air to enter that volume. Preferably, cooling holes are provided to the volume that is farthest from combustion chamber 5 (in case there are three volumes interconnected in series).

The operation of the damper arrangement of the invention is apparent from that described and illustrated and is substantially the following.

When, during gas turbine operation, pressure oscillations are generated, they cause gas to move in and out the necks N1 and N2 thus damping the pressure oscillations. Since the necks N1 and N2 have different locations, pressure oscillations having different frequencies and peak locations can be addressed.

Naturally, all features described in mentioned text may be independently provided from one another. In practice, the materials used and the dimensions can be chosen at will according to requirements and to the state of the art.

While exemplary embodiments have been described with reference to gas turbines, embodiments of the invention can be used in other applications where there is potential requirement of damping pressure oscillations.

Further, although the disclosure has been herein shown and described in what is conceived to be the most practical exemplary embodiment, it will be recognized by those skilled in the art that departures can be made within the scope of the disclosure, which is not to be limited to details described herein but is to be accorded the full scope of the appended claims so as to embrace any and all equivalent devices and apparatus.

The invention claimed is:
1. A combustion chamber with a damper arrangement, the damper arrangement comprising:
a Helmholtz damper having a plurality of interconnected volumes that are connected in series, wherein the plurality of interconnected volumes consist of two interconnected volumes, wherein the two interconnected volumes share two common sidewalls, and a lateral wall that divides the two interconnected volumes is fixed and attached to the two common sidewalls; and
a plurality of fixed first necks connecting a first interconnected volume, of the plurality of interconnected volumes, with the combustion chamber at respective contact points, wherein the plurality of contact points are each located at respective estimated anti-node positions of at least two standing wave patterns, each of the at least two standing wave patterns corresponding to a different pulsation frequency in the combustion chamber, wherein the lateral wall dividing the two interconnected volumes includes a fixed extended second neck, wherein the lateral wall is unperforated with the excep- tion of the fixed extended second neck, each of the two interconnected volumes being fixed.

2. The combustion chamber with the damper arrangement as claimed in claim 1, wherein a combination of the plurality of interconnected volumes and the plurality of fixed first necks are tuned to damp the different pulsation frequencies corresponding to the at least two standing wave patterns.

3. The combustion chamber with the damper arrangement as claimed in claim 1, wherein at least one of the plurality of fixed first necks and the fixed extended second neck comprises: one or more of a porous material, an absorptive material, an adsorptive material, a perforated screen and a metal foam.

4. The combustion chamber with the damper arrangement as claimed in claim 1, wherein at least one of the plurality of interconnected volumes and the plurality of fixed first necks is of a polygonal shape, a cubical shape, a cuboidal shape, or a spherical shape.

5. The combustion chamber with the damper arrangement as claimed in claim 1, wherein the plurality of fixed first necks consists of two necks.

6. The combustion chamber with the damper arrangement as claimed in claim 5, wherein at least one of the plurality of fixed first necks and the fixed extended second neck comprises: one or more of a porous material, an absorptive material, an adsorptive material a perforated screen and a metal foam.

7. A method for designing a Helmholtz damper arrangement for a combustion chamber, the method comprising:

providing a plurality of interconnected volumes that are connected in series, wherein the plurality of interconnected volumes consist of two interconnected volumes, wherein the two interconnected volumes share two common sidewalls, and a lateral wall that divides the two interconnected volumes is fixed and attached to the two common sidewalls;

providing a plurality of fixed first necks to connect a first interconnected volume of the plurality of interconnected volumes to the combustion chamber at respective contact points, wherein the lateral wall dividing the two interconnected volumes includes a fixed extended second neck, wherein the lateral wall is unperforated with the exception of the fixed extended second neck, each of the two interconnected volumes being fixed;

tuning a combination of the plurality of first fixed necks and the plurality of interconnected volumes to damp at least two pulsation frequencies of the combustion chamber; and locating each of the respective contact points at respective estimated anti-node positions of at least two standing wave patterns corresponding to the at least two pulsation frequencies of the combustion chamber.

8. The method as claimed in claim 7, wherein a least one of the plurality of interconnected volumes and the plurality of fixed first necks is of a polygonal shape, a cubical shape, a cuboidal shape, or a spherical shape.

* * * * *